US009230988B2

(12) United States Patent
Cheng et al.

(10) Patent No.: US 9,230,988 B2
(45) Date of Patent: Jan. 5, 2016

(54) MECHANISMS FOR FORMING RADIO FREQUENCY (RF) AREA OF INTEGRATED CIRCUIT STRUCTURE

(71) Applicant: Taiwan Semiconductor Manufacturing Co., Ltd., Hsin-Chu (TW)

(72) Inventors: Kuo-Yu Cheng, Tainan (TW); Keng-Yu Chen, Tainan (TW); Wei-Kung Tsai, Tainan (TW); Kuan-Chi Tsai, Kaohsiung (TW); Tsung-Yu Yang, Zhubei (TW); Chung-Long Chang, Dou-Liu (TW); Chun-Hung Chen, Xinpu Township, Hsinchu County (TW); Chih-Ping Chao, Hsinchu County (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 51 days.

(21) Appl. No.: 14/068,353

(22) Filed: Oct. 31, 2013

(65) Prior Publication Data

US 2015/0115381 A1 Apr. 30, 2015

(51) Int. Cl.
*H01L 27/12* (2006.01)
*H01L 21/762* (2006.01)

(52) U.S. Cl.
CPC ........ *H01L 27/1203* (2013.01); *H01L 21/7624* (2013.01); *H01L 21/76283* (2013.01)

(58) Field of Classification Search
CPC .................... H01L 21/76283; H01L 29/0649; H01L 29/66181; H01L 27/1087; H01L 27/10829

USPC ........... 257/506, 508; 438/296, 387, 424, 706
See application file for complete search history.

(56) References Cited

U.S. PATENT DOCUMENTS

| 5,065,132 A * | 11/1991 | Taddiken et al. ............. 338/334 |
| 6,395,637 B1 * | 5/2002 | Park et al. ..................... 438/706 |
| 2002/0081809 A1 * | 6/2002 | Pinto et al. .................... 438/296 |
| 2013/0193508 A1 * | 8/2013 | Lee ............................... 257/329 |

OTHER PUBLICATIONS

Pending U.S. Appl. No. 13/782,355, filed Mar. 1, 2013.

* cited by examiner

*Primary Examiner* — Evan Pert
*Assistant Examiner* — Changhyun Yi
(74) *Attorney, Agent, or Firm* — McClure, Qualey & Rodack, LLP (57) ABSTRACT

Embodiments of mechanisms of forming a radio frequency area of an integrated circuit are provided. The radio frequency area of an integrated circuit structure includes a substrate, a buried oxide layer formed over the substrate, and an interface layer formed between the substrate and the buried oxide layer. The radio frequency area of an integrated circuit structure also includes a silicon layer formed over the buried oxide layer and an interlayer dielectric layer formed in a deep trench. The radio frequency area of an integrated circuit structure further includes the interlayer dielectric layer extending through the silicon layer, the buried oxide layer and the interface layer. The radio frequency area of an integrated circuit structure includes an implant region formed below the interlayer dielectric layer in the deep trench and a polysilicon layer formed below the implant region.

20 Claims, 7 Drawing Sheets

MECHANISMS FOR FORMING RADIO FREQUENCY (RF) AREA OF INTEGRATED CIRCUIT STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

The implementation of silicon-on-insulator (SOI) technology is one of several manufacturing strategies employed to allow the continued miniaturization of microelectronic devices, which may be referred to as extending Moore's Law. Reported benefits of SOI technology relative to silicon (bulk complementary metal-oxide-semiconductor (CMOS)) processing may include, for example, lower parasitic capacitance due to isolation from the bulk silicon, which improves power consumption at matched performance, and resistance to latch-up due to isolation of the n- and p-well structures.

From a manufacturing perspective, SOI substrates are compatible with most fabrication processes. Indeed, an SOI-based process may be implemented without special equipment or significant retooling of an existing factory. The SOI process may be used to form an integrated circuit having a metal-oxide-semiconductor field-effect transistor (MOSFET) area and a radio frequency (RF) area. However, there are challenges for forming the RF area.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. Throughout the various views and illustrative embodiments, like reference numbers are used to designate like elements.

Figure 1:
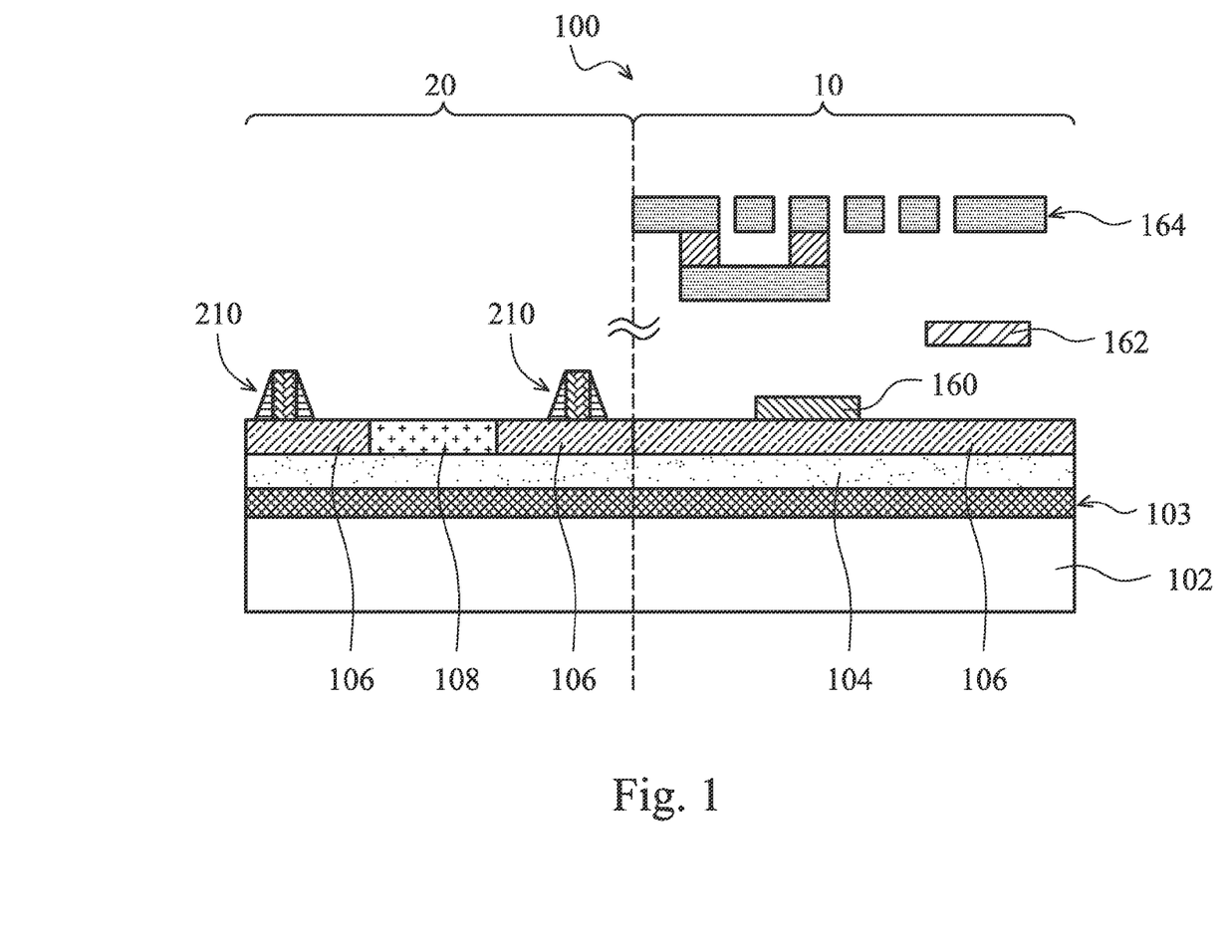
FIG. 1 shows a cross-sectional representation of an integrated circuit including a radio frequency (RF) area and a metal-oxide-semiconductor field-effect transistor (MOSFET) area in accordance with some embodiments of the disclosure.

Embodiments of mechanisms for forming a radio frequency (RF) area of an integrated circuit structure are provided. FIG. 1 shows a cross-sectional representation of an integrated circuit 100 including an RF area 10 and a metal-oxide-semiconductor field-effect transistor (MOSFET) area 20 in accordance with some embodiments of the disclosure. However, it should be noted that FIG. 1 has been simplified for the sake of clarity to better understand the inventive concepts of the disclosure. Additional features can be added to integrated circuit 100, and some of the features below can be replaced or eliminated.

Referring to FIG. 1, each of RF area 10 and MOSFET area 20 includes a substrate 102 and a buried oxide (BOX) layer 104. Substrate 102 is silicon or a silicon-containing material. Substrate 102 is a high-resistance (high-R) substrate. In some embodiments, the substrate 102 has a resistance in a range from about 750 ohms-centimeter to 10000 ohms-centimeter.

Portions of substrate 102 and buried oxide layer 104 at or near an interface between substrate 102 and buried oxide layer 104 interact with each other. The interacting portions of substrate 102 and buried oxide layer 104 behave much like a low-resistance (low-R) or lossy layer. Therefore, a low-resistance layer 103 has been depicted at the interface between substrate 102 and buried oxide layer 104. For ease of illustration, the thickness of low-resistance layer 103 has been exaggerated. The resistance of substrate 102 is higher than that of low-resistance layer 103. In some embodiments, low-resistance layer 103 has a resistance is in a range from about 12 ohms-centimeter to about 749 ohms-centimeter.

Referring to FIG. 1, MOSFET area 20 includes a silicon (Si) layer 106 separated by a shallow trench isolation (STI) region 108. Silicon layer 106 and STI region 108 are disposed over buried oxide layer 104 in MOSFET area 20. As shown in FIG. 1, the opposing portions of silicon layer 106 in MOSFET area 20 support a transistor structure 210.

RF area 10 also includes silicon layer 106. As shown, silicon layer 106 is formed over buried oxide layer 104. A silicon-on-insulator (SOI) substrate is constructed by silicon layer 106 formed over buried oxide layer 104. In some embodiments, RF area 10 includes a passive devices, such as a resistor 160, a capacitor 162, and interconnect structure 164. Interconnect structure 164 is used to suitably couple RF area 10 with another device (e.g., an inductor, a transmission line, etc.). In other words, interconnect structure 164 may be an inductor interconnect or a transmission line interconnect.

Low-resistance layer 103, which is generally inhomogeneous, may degrade the radio frequency performance of integrated circuit 100. For example, low-resistance layer 103 may permit eddy-current losses to adversely impact the quality factor (Q-factor) of an inductor. In addition, low-resistance layer 103 may cause unacceptable insertion losses for a transmission line. This is due, at least in part, to unexpected charges forming at or around the interface between high-resistance substrate 102 and buried oxide layer 104.

Figure 2A:
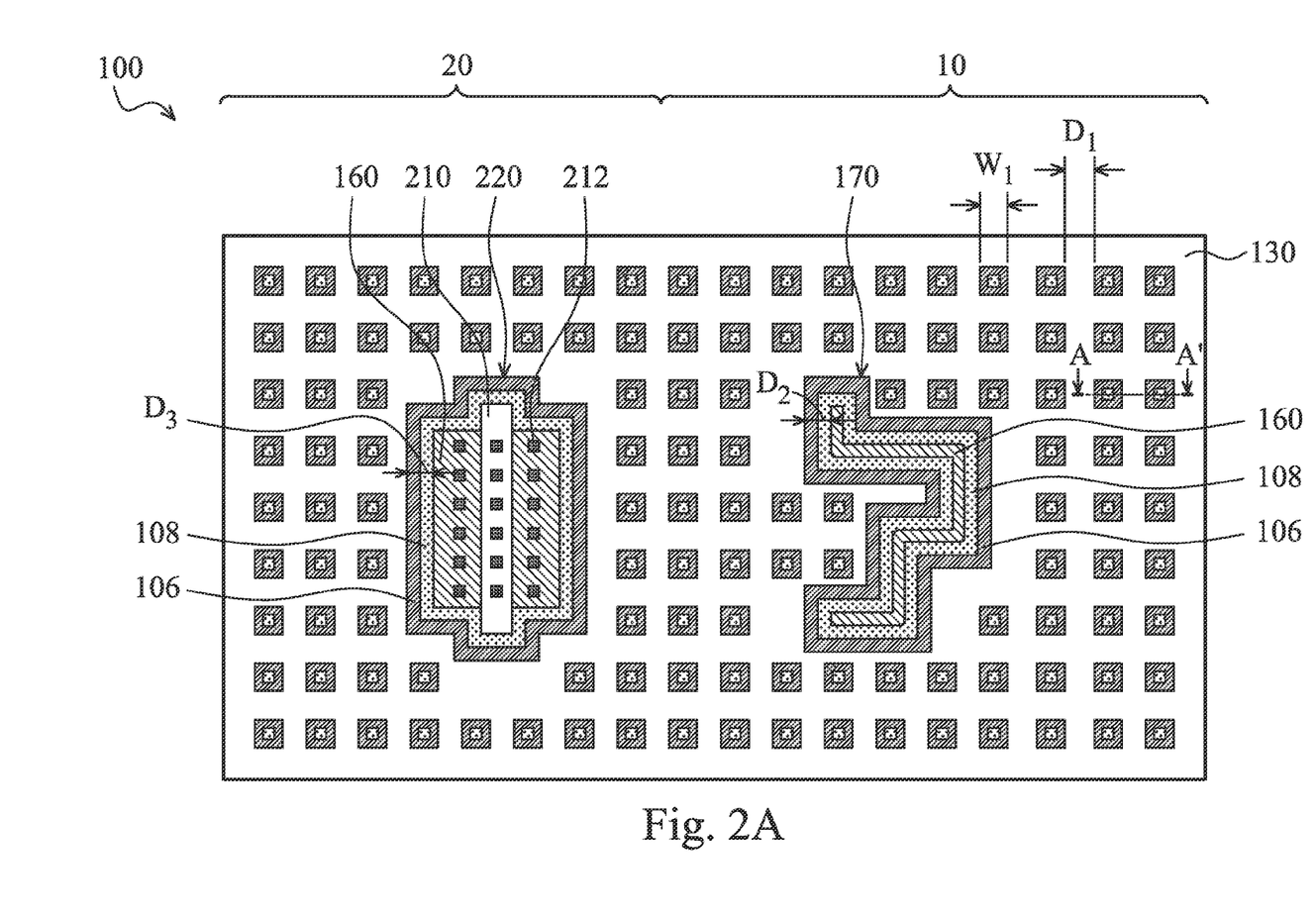
FIG. 2A shows a top-view of an integrated circuit including a radio frequency (RF) area and a metal-oxide-semiconductor field-effect transistor (MOSFET) area in accordance with some embodiments of the disclosure.

FIG. 2A shows a top-view of integrated circuit 100 including RF area 10 and MOSFET area 20 in accordance with some embodiments of the disclosure. As depicted in the top view, STI region 108 is surrounded or encircled by silicon layer 106. In other words, STI regions 108 and silicon layer 106 collectively form islands disposed within a sea of an implant region 130 beneath a deep trench (DT) 120 (shown in FIG. 2B).

RF area 10 includes a resistor region 170 having resistor 160. MOSFET area 20 includes a field-effect transistor (FET) region 220 having silicon layer 106, transistor structure 210 and contacts 212. Contacts 212 are formed above silicon layer 106 and transistor structure 210 to electrically connect to metal lines (not shown).

As shown in FIG. 2A, STI regions 108 and silicon layer 106 are arranged in a regular pattern. The regular pattern may have a square, circular, or rectangular shape. In other words, as depicted in the top view, implant region 130 is formed between two adjacent patterns to form a fence-like shape. In some other embodiments, STI region 108 and silicon layer 106 are arranged in an irregular pattern.

In some embodiments, the pattern including STI regions 108 and silicon layer 106 has a width $W_1$ in a range from 0.5 um to 10 um. In some embodiments, the distance $D_1$ between two adjacent patterns is in a range from 0.5 um to about 100 um. In RF area 10, the distance $D_2$ between resistor 160 and implant region 130 is a range from 0.1 um to 50 um. In MOSFET area 20, the distance $D_3$ between silicon layer 106 and implant region 130 is a range from 0.1 um to 50 um.

Figure 2B:
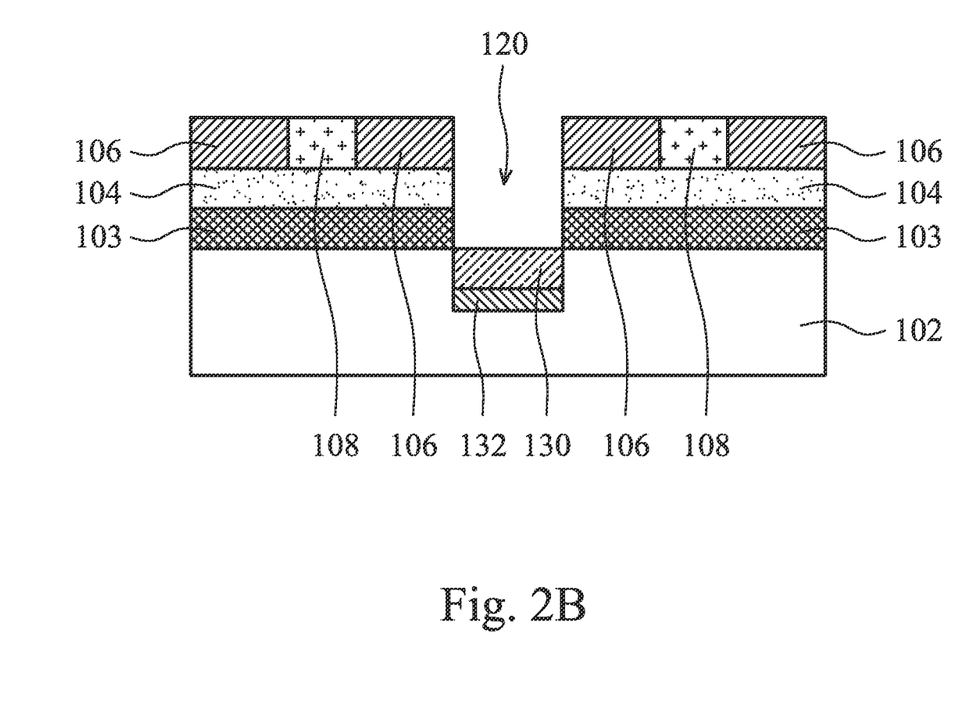
FIG. 2B shows a cross-sectional representation along AA' line in FIG. 3A in accordance with some embodiments of the disclosure.
Figure 3A:
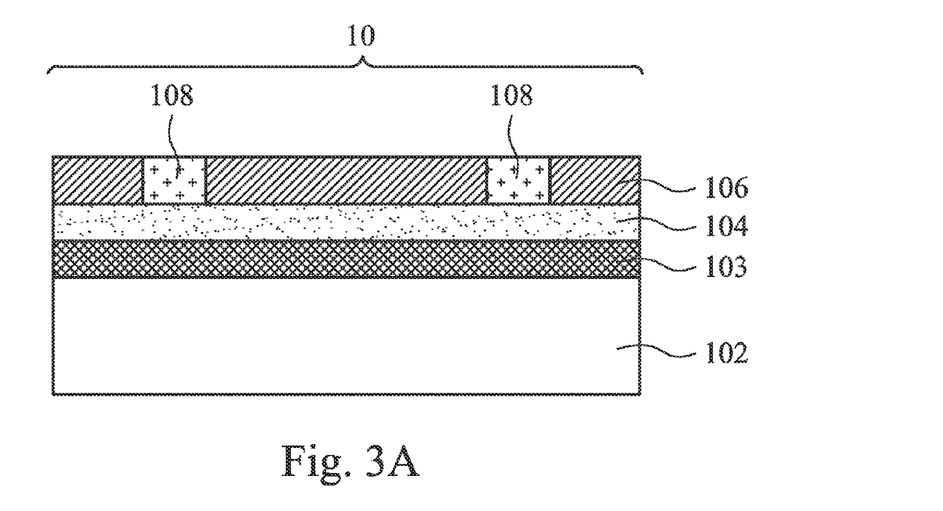
FIG. 3A-3D show cross-sectional representations of various stages of forming a radio frequency area having a deep trench (DT) in accordance with some embodiments of the disclosure.

FIG. 2B shows a cross-sectional representation along AA' line in FIG. 3A. Two adjacent patterns including STI regions 108 and silicon layer 106 are separated by deep trench (DT) 120. Implant region 130 is exposed by deep trench 120, and a polysilicon layer 132 is below implant region 130. Formation of deep trench 120, implant region 130 and polysilicon layer 132 will be described detail later.

FIG. 3A-3D show cross-sectional representations of various stages of forming RF area 10 having deep trench (DT) 120, in accordance with some embodiments of the disclosure. RF area 10 of FIG. 3A is depicted in an initial stage after silicide formation.

Referring to FIG. 3A, RF area 10 initially includes substrate 102, low-resistance layer 103, buried oxide layer 104, silicon layer 106 and STI region 108. A portion of STI region 108 is formed on either side of, or separated by a portion of silicon layer 106. In addition, STI region 108 and silicon layer 106 are all formed over buried oxide layer 104. In some embodiments, a thin layer of silicon oxide layer (not shown) is formed or grown over silicon layer 106 by a thermal oxidation process.

Figure 3B:
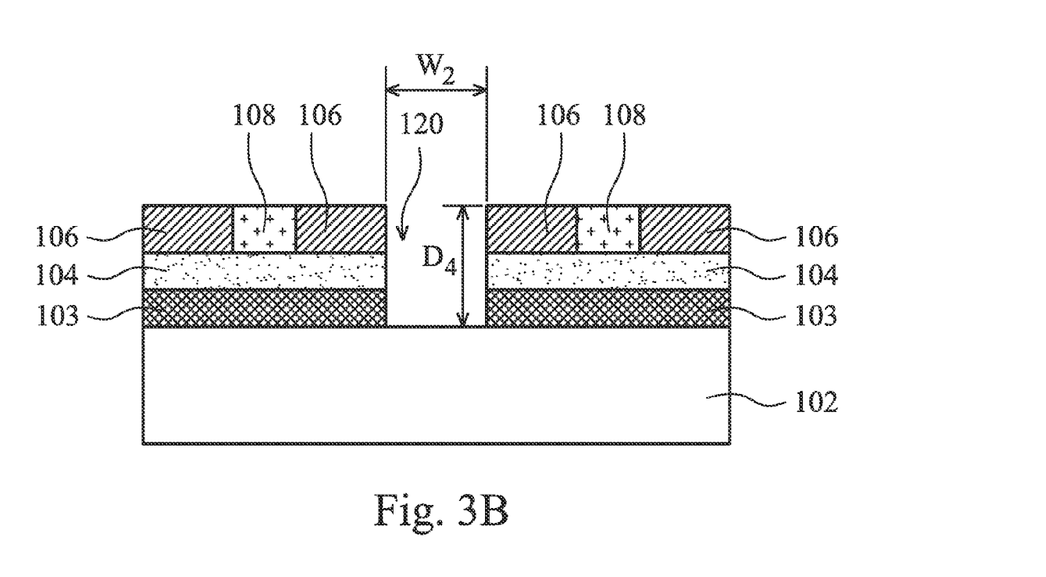

After forming silicon layer 106 and STI region 108, deep trench 120 is formed by etching through silicon layer 106, buried oxide layer 104 and low-resistance layer 103 as shown in FIG. 3B in accordance with some embodiments of the disclosure. It should be noted that deep trench 120 passes through low-resistance layer 103, the conduction of low-resistance layer 103 is blocked by deep trench 120.

Deep trench 120 is formed by a photolithography process and etching process. The photolithography process includes processing steps of photoresist coating, soft baking, mask aligning, exposing, post-exposure baking, developing photoresist and hard baking. The etching process includes a wet etching process or a dry etching process.

In some embodiments, deep trench 120 has a width $W_2$ in a range from 0.5 um to 100 um. If width $W_2$ of deep trench 120 is too small, unexpected insertion losses are increased. If width $W_2$ of deep trench 120 is too large, deep trench 120 may occupy too much space.

As shown in FIG. 3B, deep trench 120 is formed through low-resistance layer 103 and above the top surface of substrate 102. In some other embodiments, deep trench 120 extends into substrate 102. In some embodiments, deep trench 120 has a depth $D_4$ in a range from 0.5 um to 10 um.

Figure 3C:
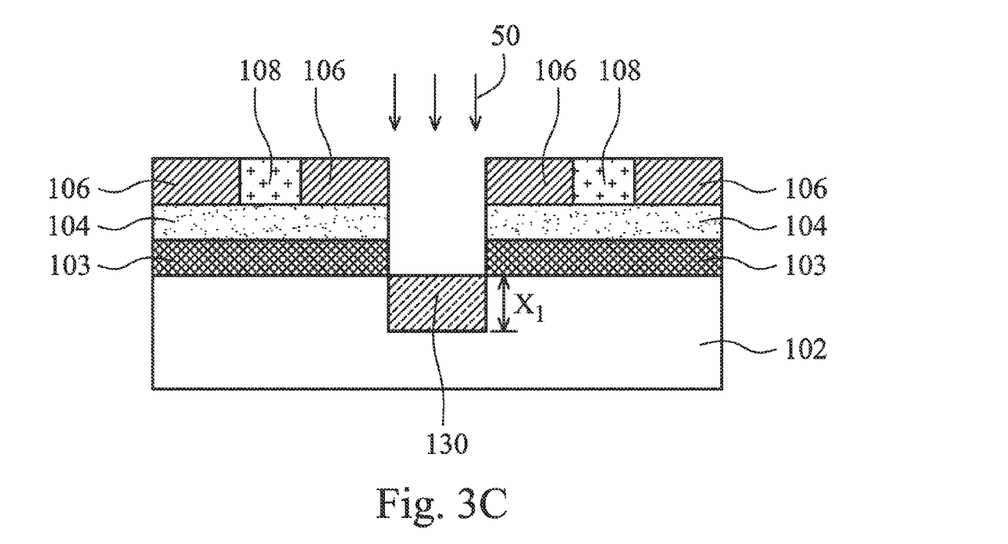

After deep trench 120 is formed, implant region 130 is formed in substrate 102, as shown in FIG. 3C in accordance with some embodiments of the disclosure. In some embodiments, a portion of substrate 102 exposed by deep trench 120 is implanted or doped by an implanting process 50. Therefore, implant region 130 is formed in substrate 102 beneath deep trench 120.

Implanting process 50 is performed by using quadrivalent elements, octavalent elements or applicable elements. It should be noted that the conductivity of implant region 130 doped with the quadrivalent elements or octavalent elements is lower than that of substrate 102 without implant region 130. In other words, the resistance of implant region 130, doped with the quadrivalent elements or octavalent elements, is higher than that of substrate 102 without implant region 130. Therefore, implant region 130 forms a barrier to block the migration of electrons from whole substrate to a defined and limited are. By formation of implant region 130, the eddy current produced from resistor 160, capacitor 162 or interconnect structure 164 will decrease obviously. In addition, the cross talk between substrate 102 and RF device (such as resistor 160 or capacitor 162) also decreased.

In some embodiments, implanting process 50 is performed by using argon (Ar), xenon (Xe), silicon (Si), germanium (Ge) or a combination thereof. In some embodiments, implanting process 50 is operated under a power in a range from about 10 KeV to about 150 keV. Therefore, implant region 130 is doped with dopants, such as argon (Ar), xenon (Xe), silicon (Si) or germanium (Ge). In some embodiments, implant region 130 is amorphous silicon. In some embodiments, implant regions 130 are doped with silicon (Si) having a concentration in a range from 10E14 to 10E17 atom/cm$^2$. In some embodiments, implant regions 130 extend from the bottom surface of deep trench 120 to a depth $X_1$ in a range from about 10 A to about 10000 A.

Figure 3D:
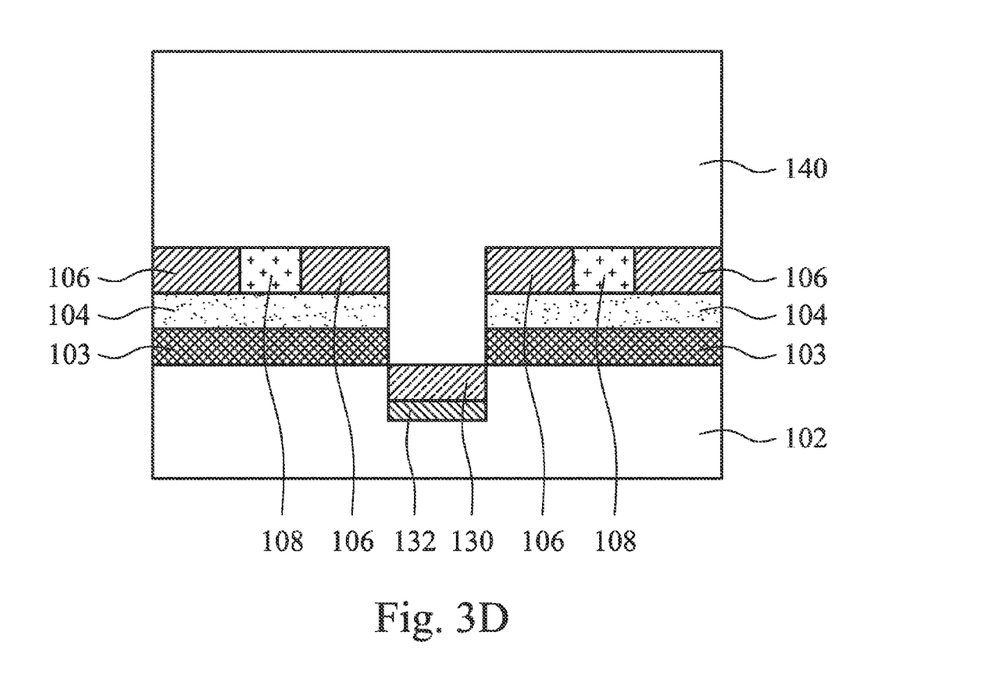

After implant region 130 is formed, interlayer dielectric (ILD) layer 140 is formed as shown in FIG. 3D in accordance with some embodiments of the disclosure. Interlayer dielectric (ILD) layer 140 is formed in deep trench 120 and over silicon layer 106 and STI region 108.

ILD layer 140 is made of silicon oxide, doped or undoped silicon oxide, undoped silicate glass (USG), phosphorus-doped silicon glass (PSG), boron phosphorus silicate glass (BPSG), phenyl triethoxy silicate (PTEOS) or boron phosphorous tetraethyl silicate (BPTEOS). ILD 140 is formed by a chemical vapor deposition (CVD) process, high-density plasma CVD process (HDP CVD), spin coating or deposition furnace.

Afterwards, a polysilicon layer 132 is formed below implant region 130 by performing a thermal treatment process as shown in FIG. 3D in accordance with some embodiments of the disclosure. The thermal treatment process is used to destroy and rebuild the arrangement of the molecules in implant region 130. As a result, polysilicon layer 132 with poly-crystalline structure is obtained. It should be noted that, compared with substrate 102 with single-crystalline structure, the molecules in polysilicon layer 132 with a poly-crystalline structure are arranged irregularly. Therefore the migration of electrons is further blocked by polysilicon layer 132.

In some embodiments, substrate 102 is put in a furnace to perform the thermal treatment process. In some embodiments, the thermal treatment process is operated at a temperature in a range from about 400° C. to about 1000° C.

After the thermal treatment process, polysilicon layer 132 is formed below implant region 130. In some embodiments, a sum of the thickness of implant region 130 and the thickness of polysilicon layer 132 is in a range from 10 A to 1000 A. In some embodiments, the ratio of the thickness of polysilicon layer 132 to the sum of the thickness of implant region 130 and polysilicon layer 132 is in a range from 10% to about 90%.

Before forming interlayer dielectric (ILD) layer 140 (as shown in FIG. 3D), an etch stop layer (not shown) may be conformally formed in deep trench 120 and on silicon layer 106. In some embodiments, the etch stop layer is silicon nitride (SiN).

After forming polysilicon layer 132, substrate 102 may continue with other processes to form other devices above ILD 140, such as capacitor 162, or interconnect structure 164. The above-mentioned processes may be combined in a normal logic process and take full advantage of the silicon-on-insulator (SOI) process.

From the description above, deep trench 120 is formed through low-resistance layer 103. As a result, the conduction of low-resistance layer 103 is blocked by deep trench 120. In addition, implant region 130 formed below deep trench 120 has a higher resistance to block the migration of electrons. Polysilicon layer 132 is formed below implant region 130 to further prevent the electrons from migrating. Therefore, unexpected insertion losses or eddy currents are decreased by the formation of deep trench 120, implant region 130 and polysilicon layer 132 (by the etching process, implant process, and thermal treatment process).

Figure 4:
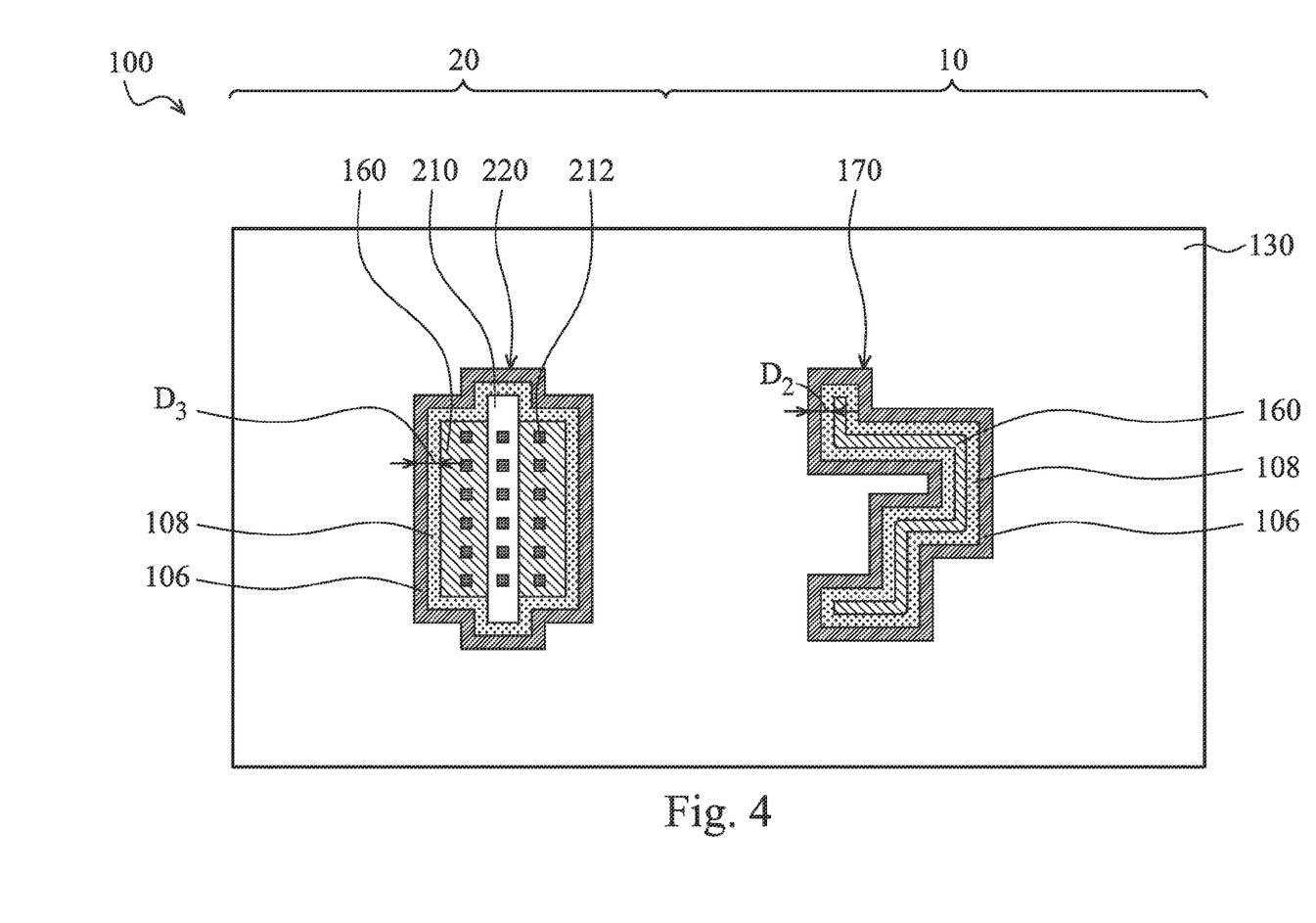
FIG. 4 shows a top-view of an integrated circuit including a radio frequency (RF) area and a metal-oxide-semiconductor field-effect transistor (MOSFET) area in accordance with some embodiments of the disclosure.

FIG. 4 shows a top-view of an integrated circuit including RF area 10 and MOSFET area 20 in accordance with some embodiments of the disclosure. FIG. 4 is similar to FIG. 2A, the difference is that the overall area of integrated circuit 100 is occupied by implant region 130 except for resistor region 170 and FET region 220 in FIG. 4.

As shown in FIG. 4, as depicted in the top view, resistor region 170 is surrounded by implant region 130, and FET region 220 is also surrounded by implant region 130. In other words, resistor region 170 and FET region 220 are separated by implant region 130.

Figure 5:
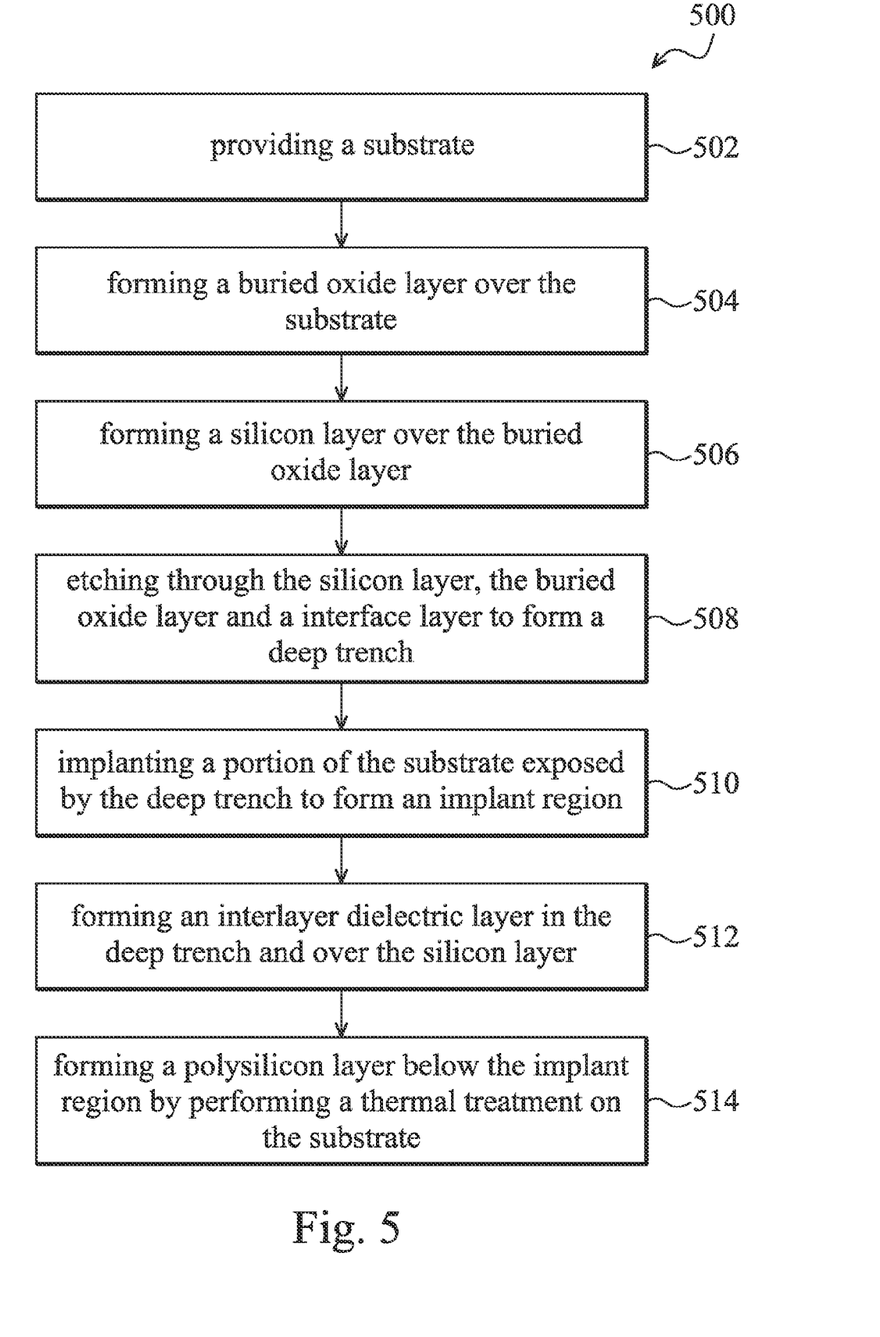
FIG. 5 shows a flowchart of a method for forming a radio frequency area having a deep trench (DT) in accordance with some embodiments of the disclosure.

FIG. 5 shows a flowchart of a method for forming a radio frequency area having a deep trench (DT) in accordance with some embodiments of the disclosure.

In operation 502, substrate 102 is provided. Substrate 102 is a high-resistance (high-R) substrate.

In operation 504, buried oxide (BOX) layer 104 is formed over substrate 102. Low-resistance layer (or interface layer) 103 is formed between substrate 102 and buried oxide layer 104. The resistance of substrate 102 is higher than that of low-resistance layer 103.

In operation 506, silicon layer 106 is formed over buried oxide layer 104. In addition, STI region 108 is also formed over buried oxide layer 104. A portion of STI region 108 is formed on either side of, or separated by a portion of silicon layer 106.

In operation 508, silicon layer 106, buried oxide layer 104 and low-resistance layer 103 are etched to form deep trench 120. A portion of substrate 102 is exposed by deep trench 120.

In operation 510, a portion of substrate 102 exposed by deep trench 120 is implanted or doped to form implant region 130.

In operation 512, interlayer dielectric (ILD) layer 140 is formed in deep trench 120 and over silicon layer 106.

In operation 514, polysilicon layer 132 is formed below implant region 130 by performing a thermal treatment process on substrate 102.

Embodiments of mechanisms of forming a radio frequency area of an integrated circuit structure are provided. A low-resistance layer is formed between a high-resistance substrate and a buried oxide (BOX) layer. In order to eliminate the negative effects of the low-resistance layer, a deep trench (DT) is formed through the low-resistance layer. Afterwards, an implant region and a polysilicon layer are formed beneath the deep trench to block the migration of electrons. Therefore, unexpected insertion losses or eddy currents are decreased by formation of the deep trench, the implant region and the polysilicon layer.

In some embodiments, a radio frequency area of an integrated circuit structure is provided. The radio frequency area of an integrated circuit structure includes a substrate, a buried oxide layer formed over the substrate, and an interface layer formed between the substrate and the buried oxide layer. The radio frequency area of an integrated circuit structure also includes a silicon layer formed over the buried oxide layer and an interlayer dielectric layer formed in a deep trench. The radio frequency area of an integrated circuit structure further includes the interlayer dielectric layer extending through the silicon layer, the buried oxide layer and the interface layer. The radio frequency area of an integrated circuit structure includes an implant region formed below the interlayer dielectric layer in the deep trench and a polysilicon layer formed below the implant region.

In some embodiments, a radio frequency area of an integrated circuit structure is provided. The radio frequency area of an integrated circuit structure includes a substrate having a first resistance and a buried oxide layer formed over the substrate. The radio frequency area of an integrated circuit structure also includes an interface layer formed between the substrate and the buried oxide layer, the interface layer has a second resistance lower than the first resistance. The radio frequency area of an integrated circuit structure further includes a silicon layer formed over the buried oxide layer. The radio frequency area of an integrated circuit structure also includes an interlayer dielectric layer formed in a deep trench, and the interlayer dielectric layer extends through the silicon layer, the buried oxide layer and the interface layer. The radio frequency area of an integrated circuit structure includes an implant region formed in the substrate and below the interlayer dielectric layer. The radio frequency area of an integrated circuit structure also includes a polysilicon layer formed below the implant region.

In some embodiments, a method for forming a radio frequency area of an integrated circuit structure is provided. The method includes providing a substrate, forming a buried oxide layer over the substrate, and an interface layer is formed between the substrate and the buried oxide layer. The method also includes forming a silicon layer over the buried oxide layer and etching through the silicon layer, the buried oxide layer and the interface layer to form a deep trench. The method further includes implanting a portion of the substrate exposed by the deep trench to form an implant region, and thermal treating the substrate to form a polysilicon layer below the implant region. The method further includes forming an interlayer dielectric layer in the deep trench and over the silicon layer.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A radio frequency area of an integrated circuit structure, comprising:
    a substrate;
    a buried oxide layer formed over the substrate, wherein an interface layer is formed between the substrate and the buried oxide layer;
    a silicon layer formed over the buried oxide layer;
    an interlayer dielectric layer formed in a deep trench, wherein the interlayer dielectric layer extends through the silicon layer, the buried oxide layer and the interface layer;
    an implant region formed below the interlayer dielectric layer inside the deep trench; and
    a polysilicon layer formed below the implant region, wherein the overall region of the polysilicon layer is formed below the implant region, and wherein a top surface of the implant region is level with a bottom surface of the interface layer.

2. The radio frequency area of an integrated circuit structure as claimed in claim 1, a first resistance of the substrate is higher than a second resistance of the interface layer.

3. The radio frequency area of an integrated circuit structure as claimed in claim 2, wherein the first resistance is in a range from about 750 to about 10000 ohms-centimeter.

4. The radio frequency area of an integrated circuit structure as claimed in claim 1, wherein the interface layer is inhomogeneous.

5. The radio frequency area of an integrated circuit structure as claimed in claim 1, wherein the deep trench has a depth in a range from 0.5 um to 10 um.

6. The radio frequency area of an integrated circuit structure as claimed in claim 1, wherein the deep trench has a width in a range from 0.5 um to 100 um.

7. The radio frequency area of an integrated circuit structure as claimed in claim 1, wherein a sum of a thickness of the implant region and a thickness of the polysilicon layer is in a range from 10 A to 10000 A.

8. The radio frequency area of an integrated circuit structure as claimed in claim 7, wherein a ratio of the thickness of the polysilicon layer to the sum of the thickness of the implant region and the polysilicon layer is in a range from 10% to about 90%.

9. The radio frequency area of an integrated circuit structure as claimed in claim 1, further comprising:
    a shallow trench isolation (STI) region formed on the substrate, wherein the STI region is surrounded by the silicon layer.

10. The radio frequency area of an integrated circuit structure as claimed in claim 9, wherein the STI region and the silicon layer are arranged in a regular pattern, and the pattern comprises a square, circular, or rectangular shape.

11. The radio frequency area of an integrated circuit structure as claimed in claim 10, wherein the implant region is formed between two adjacent patterns to form a fence-like shape.

12. A radio frequency area of an integrated circuit structure, comprising:
    a substrate having a first resistance;
    a buried oxide layer formed over the substrate;
    an interface layer formed between the substrate and the buried oxide layer, wherein the interface layer has a second resistance lower than the first resistance;
    a silicon layer formed over the buried oxide layer;
    an interlayer dielectric layer formed in a deep trench, wherein the interlayer dielectric layer extends through the silicon layer, the buried oxide layer and the interface layer;
    an implant region formed in the substrate and below the interlayer dielectric layer, wherein the implant region is inside the deep trench; and
    a polysilicon layer formed below the implant region, wherein the overall region of the polysilicon layer is formed below the implant region, and wherein a top surface of the implant region is level with a bottom surface of the interface layer.

13. The radio frequency area of an integrated circuit structure as claimed in claim 12, wherein opposing portions of the interface layer are separated from each other by at least one of the interlayer dielectric layer in the deep trench and the implant region in the substrate.

14. The radio frequency area of an integrated circuit structure as claimed in claim 12, further comprising:
    a shallow trench isolation (STI) region formed on the substrate, wherein the STI region is surrounded by the silicon layer.

15. The radio frequency area of an integrated circuit structure as claimed in claim 12, further comprising:
    at least one of a resistor, a capacitor and an inductor formed over the interlayer dielectric layer.

16. The radio frequency area of an integrated circuit structure as claimed in claim 12, wherein the deep trench has a depth in a range from 0.5 um to 10 um.

17. The radio frequency area of an integrated circuit structure as claimed in claim 12, wherein the overall area of integrated circuit is occupied by the implant region, except for a resistor region and a field-effect transistor (FET) region.

18. The radio frequency area of an integrated circuit structure as claimed in claim 12, wherein the interface layer is inhomogeneous.

19. The radio frequency area of an integrated circuit structure as claimed in claim 12, wherein a ratio of the thickness of the polysilicon layer to the sum of the thickness of the implant region and the polysilicon layer is in a range from 10% to about 90%.

20. The radio frequency area of an integrated circuit structure as claimed in claim 14, wherein the STI region and the silicon layer are arranged in a regular pattern, and the pattern comprises a square, circular, or rectangular shape.

* * * * *